US012057318B2

(12) United States Patent
Wang (10) Patent No.: US 12,057,318 B2
(45) Date of Patent: Aug. 6, 2024

(54) METHOD FOR FORMING FILM LAYER (71) Applicant: CHANGXIN MEMORY TECHNOLOGIES, INC., Hefei (CN)

(72) Inventor: Zhonglei Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 411 days.

(21) Appl. No.: 17/448,885

(22) Filed: Sep. 25, 2021

(65) Prior Publication Data

US 2022/0102149 A1 Mar. 31, 2022

Related U.S. Application Data (63) Continuation of application No. PCT/CN2021/107083, filed on Jul. 19, 2021.

(30) Foreign Application Priority Data

Sep. 29, 2020 (CN) .......................... 202011051630.3

(51) Int. Cl.
  *H01L 21/285* (2006.01)
  *H01J 37/32* (2006.01)
  *H01L 21/311* (2006.01)

(52) U.S. Cl.
  CPC .. *H01L 21/28568* (2013.01); *H01J 37/32449* (2013.01); *H01L 21/31116* (2013.01); *H01J 2237/332* (2013.01); *H01J 2237/334* (2013.01)

(58) Field of Classification Search
  CPC ......... H01L 21/28568; H01L 21/31116; H01L 21/02063; H01L 21/76814; H01L 21/76843; H01L 21/76856; H01L 21/768; H01L 21/02252; H01L 21/02274; H01L 21/02277; H01L 21/02315; H01L 21/0234; H01L 21/28211; H01L 21/76862; H01J 37/32449; H01J 2237/332; H01J 2237/334
  See application file for complete search history.

(56) References Cited

U.S. PATENT DOCUMENTS

| 5,926,737 | A | 7/1999 | Ameen |
| 7,838,428 | B2 | 11/2010 | Chen |
| 7,994,049 | B2 | 8/2011 | Futase |
| 10,229,826 | B2 | 3/2019 | Tarafdar et al. |
| 2007/0224824 | A1 | 9/2007 | Chen |
| 2008/0311718 | A1* | 12/2008 | Futase ............... H01L 21/28556 438/296 |
| 2018/0114694 | A1 | 4/2018 | Tarafdar et al. |

(Continued)

FOREIGN PATENT DOCUMENTS

| CN | 101325176 A | 12/2008 |
| CN | 102543672 A | 7/2012 |
| CN | 102832112 A | 12/2012 |

(Continued)

*Primary Examiner* — Mohammad A Rahman
(74) *Attorney, Agent, or Firm* — Syncoda LLC; Feng Ma (57) ABSTRACT A method for forming a film layer includes: a substrate is provided; a pretreatment step is performed, in which the pretreatment step includes providing a reaction source gas, which forms attachment points on the substrate; and a deposition step is performed, in which the reaction source gas is formed into a plasma, which is deposited on the substrate based on the attachment points to form a first film layer.

10 Claims, 9 Drawing Sheets (56) References Cited

U.S. PATENT DOCUMENTS

2018/0330963 A1  11/2018  Tapily

FOREIGN PATENT DOCUMENTS

| CN | 107978510 A | 5/2018 |
| CN | 108109955 A | 6/2018 |
| CN | 111584348 A | 8/2020 |
| CN | 111627859 A | 9/2020 |

* cited by examiner

METHOD FOR FORMING FILM LAYER

CROSS-REFERENCE TO RELATED APPLICATIONS

This application is a continuation of International Application No. PCT/CN2021/107083 filed on Jul. 19, 2021, which claims priority to Chinese Patent Application No. 202011051630.3 filed on Sep. 29, 2020. The disclosures of these applications are hereby incorporated by reference in their entirety.

BACKGROUND

With the development of the semiconductor industry, the pros and cons of a semiconductor element manufacturing process are closely related to the deposition efficiency and film layer quality of a film layer deposition process.

SUMMARY

The embodiments of this disclosure relate to the field of semiconductors, and in particular relate to a method for forming a film layer.

The embodiments of this disclosure provide a method for forming a film layer, including the following operations. A substrate is provided. A pretreatment step is performed, in which the pretreatment step includes providing a reaction source gas, in which the reaction source gas forms attachment points on the substrate. A deposition step is performed, the reaction source gas is formed into plasma, and the plasma is deposited on the substrate based on the attachment points to form a first film layer.

BRIEF DESCRIPTION OF THE DRAWINGS

One or more embodiments are exemplified by the figures in the corresponding drawings. These exemplified descriptions do not constitute a limitation on the embodiments. Unless otherwise stated, the figures in the drawings do not constitute a scale limitation.

DETAILED DESCRIPTION

In order to make the objectives, technical solutions and advantages of the embodiments of this disclosure clearer, the embodiments of this disclosure will be described in detail below with reference to the accompanying drawings. However, a person of ordinary skill in the art can understand that in the embodiments of this disclosure, many technical details are proposed for readers to better understand this disclosure. However, even without these technical details and various changes and modifications based on the following embodiments, the technical solutions claimed in this disclosure can also be realized.

The deposition rate of the film layer and the step coverage rate of the film layer after deposition can be important aspects of the film layer deposition process.

In a typical film layer deposition process, a plasma reaction source gas is often used to reactively deposit the film layer, the deposition rate is low, and the step coverage rate of the film layer after deposition is also low, which affects the quality of the film layer.

FIG. 1 to FIG. 6 are schematic structural diagrams corresponding to steps in a method for forming a film layer provided by the first embodiment of this disclosure.

Figure 4:
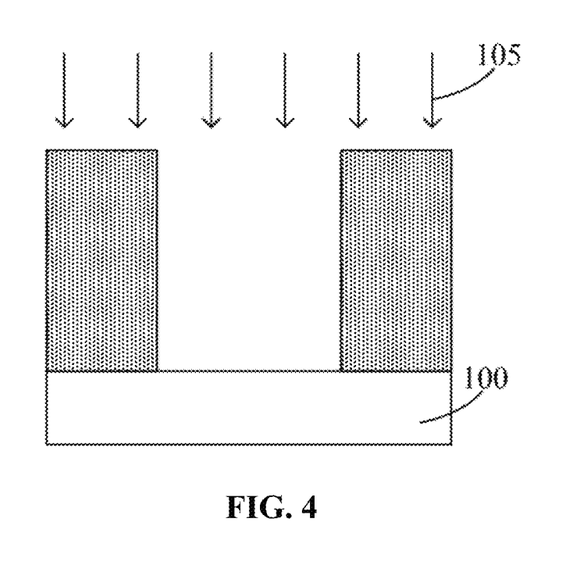
FIG. 4 is a fourth schematic structural diagram corresponding to a step in a method for forming a film layer provided by the first embodiment of this disclosure.
Figure 5:
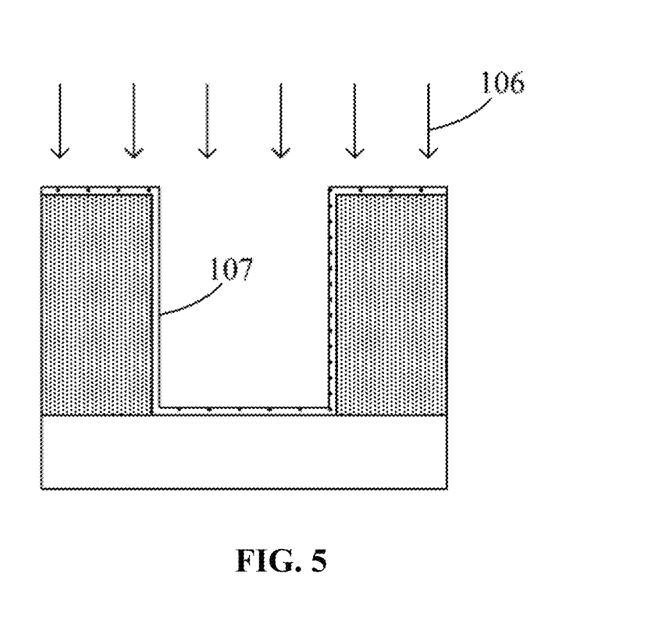
FIG. 5 is a fifth schematic structural diagram corresponding to a step in a method for forming a film layer provided by the first embodiment of this disclosure.

Referring to FIG. 4 and FIG. 5, a method for forming a film layer includes the following operations. A substrate 100 is provided. A pretreatment step is performed, in which the pretreatment step includes providing a reaction source gas 105, and the reaction source gas 105 forms attachment points (not marked) on the substrate 100. A deposition step is performed, in which the reaction source gas 105 is formed into a plasma 106, and the plasma 106 is deposited on the substrate 100 based on the attachment points to form a first film layer 107.

The material of the substrate 100 may be monocrystalline silicon, silicon-on-insulator (SOI), stack silicon-on-insulator (SSOI), stack silicon germanium-on-insulator (S-SiGeOI), silicon germanium-on-insulator (SiGeOI), and germanium-on-insulator (GeOI). In this embodiment, the substrate 100 is monocrystalline silicon.

Figure 1:
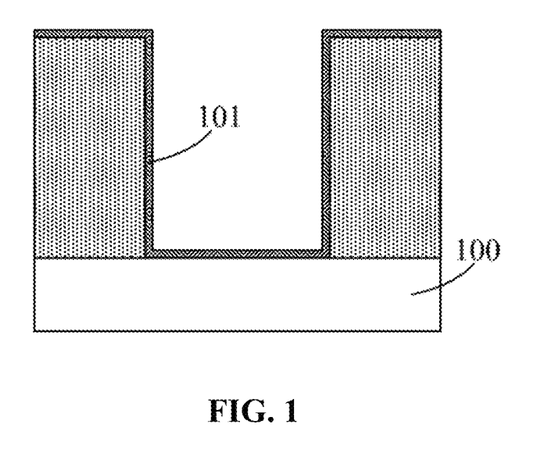
FIG. 1 is a first schematic structural diagram corresponding to a step in a method for forming a film layer provided by the first embodiment of this disclosure.
Figure 2:
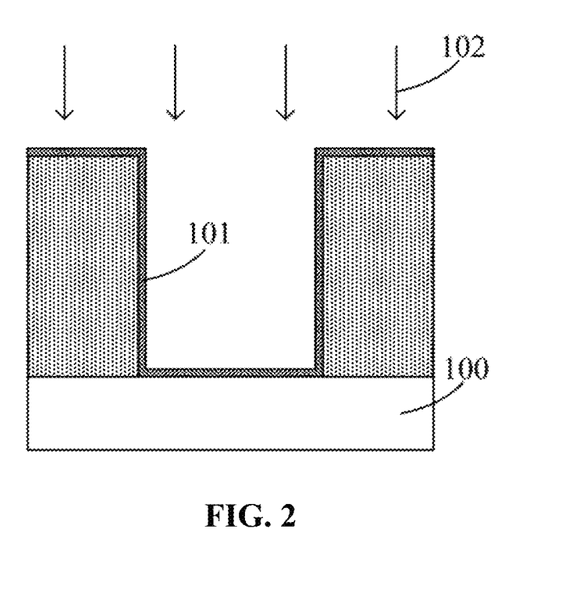
FIG. 2 is a second schematic structural diagram corresponding to a step in a method for forming a film layer provided by the first embodiment of this disclosure.

Referring to FIG. 1 and FIG. 2, in the first embodiment, a defective layer 101 is formed on the substrate 100. The defective layer 101 may be the case of an abnormality of a machine in the film layer deposition process, resulting in poor quality of the deposited film layer, or the case that the surface of the film layer is partially oxidized to form the defective layer 101.

The defective layer 101 has the same elements as a first film layer 107 (as shown in FIG. 5).

A pulsed etching step is performed, in which an etching gas 102 is supplied to the defective layer 101 at intervals to remove the defective layer 101, and an inert gas is continuously supplied to the defective layer 101 to take away etching by-products.

In this way, the defective layer 101 may be removed relatively gently by a pulsed etching method, avoiding the risk that a continuous violent etching reaction may cause part of the defective film layer to fall off and contaminate a reaction chamber. After the pulsed etching, the film layer can still be deposited to avoid the problem that a wafer is difficult to be repaired and thus is directly scrapped after an abnormality of the machine occurs.

In the first embodiment, the defective layer 101 may be a titanium oxide layer.

In the first embodiment of this disclosure, the etching gas 102 has the same elements as the reaction source gas 105 forming the first film layer 107. In this way, introduction of excess elements into the reaction chamber may be reduced, and the effect on subsequent reactions may be reduced. Moreover, the etching gas 102 is one of the reaction source gases 105, and a new gas is not needed, which facilitates the pulsed etching step. Therefore, the defective layer 101 is quickly etched after the defective layer 101 is formed, and the above step may be performed in the same chamber.

In this embodiment, the etching gas 102 includes titanium tetrachloride, and the inert gas may be argon gas. Titanium tetrachloride gas reacts violently with the titanium oxide layer. By the pulsed etching method, too violent reaction between titanium tetrachloride and titanium is prevented, thus preventing part of the film layer to fall off and contaminate the chamber.

Specifically, the process parameters of the pulsed etching step include: the flow rate of titanium tetrachloride is 1-50 sccm (standard cubic centimeter per minute), and specifically may be 10 sccm, 20 sccm, 30 sccm or 40 sccm; the flow rate of the argon gas is 1000 sccm-2000 sccm, and specifically may be 1300 sccm, 1500 sccm, or 1800 sccm; the temperature of the reaction chamber is 400-710 degrees Celsius, and specifically may be 500 degrees Celsius, 600 degrees Celsius, or 700 degrees Celsius; the pressure of the reaction chamber is 1-20 Torr, and specifically may be 5 Torr, 10 Torr, or 15 Torr; and the number of times that the etching gas 102 is supplied in a pulsed manner is 100-400, and specifically may be 200, 250, or 300.

In one embodiment, the etching gas 102 is supplied for the defective layer 101 at intervals, and the time for which the etching gas 102 is supplied each time is 0.1-40 seconds, and specifically may be 10 seconds, 20 seconds, or 30 seconds. The interval between every two supplies of the etching gas 102 is 0.1-5 seconds, and specifically may be 2 seconds, 3 seconds, or 4 seconds.

When the etching gas 102 reacts with the defective layer 101, etching by-products will be produced. The etching by-products will contaminate the reaction chamber and affect the reaction in the reaction chamber. Therefore, in this embodiment, continuous supply of inert gas to the defective layer 101 can take away the etching by-products and ensure the cleanliness of the reaction chamber.

In other embodiments, the reaction chamber is vacuumized at the interval between every two supplies of the etching gas to take away the etching by-products, thereby ensuring the cleanliness of the reaction chamber.

In an example, no inert gas is supplied, but the reaction chamber is vacuumized to take away the etching by-products at the interval between every two supplies of the etching gas.

Specifically, the chamber pressure during vacuumizing is 0.1-1 Torr, and specifically may be 0.4 Torr, 0.6 Torr, or 0.8 Torr. Under the pressure, the etching by-products in the chamber can be completely vacuumizing away, thereby ensuring the cleanliness of the reaction chamber.

Figure 3:
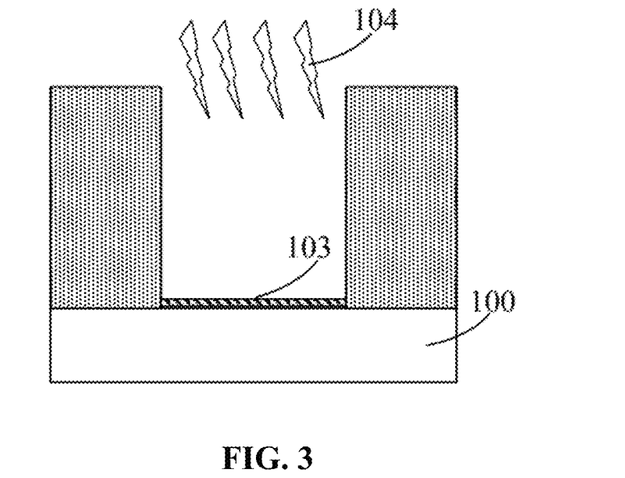
FIG. 3 is a third schematic structural diagram corresponding to a step in a method for forming a film layer provided by the first embodiment of this disclosure.

Referring to FIG. 3, after the defective layer 101 is removed by etching, a silicon titanide layer (not shown in the figure) is exposed. The silicon titanide layer is formed by the reaction between the substrate 100 and the defective layer 101, and the silicon titanide layer is easily oxidized in the air to form a native oxide layer 103 at the interface. The presence of the oxide layer 103 will increase the surface contact resistance between the first film layer 107 and the substrate 100 and affect the product yield. In this embodiment, before the first film layer 107 is deposited, a substrate surface treatment step 104 is performed to remove the oxide layer 103.

The oxide layer 103 includes silicon oxide.

Specifically, the oxide layer 103 is silicon dioxide, and in the substrate surface treatment step 104, plasma ammonia gas, argon gas, and hydrogen gas are used to react with and thus remove the oxide layer 103. The specific reactions are:

In the substrate surface treatment step 104, the oxide layer 103 is removed not only by using the ammonia gas, argon gas, and hydrogen gas plasmas to reduce part of the oxide, but also by using the bombardment effect of the plasma itself to remove part of the oxide and some impurities. In this way, the oxide layer 103 irrelevant to the subsequently deposited first film layer 107 is removed, the contact resistance between the first film layer 107 and the substrate 100 is reduced, the first film layer 107 disconnected from the substrate 100 caused by a too high contact resistance is prevented, and the uniformity of the surface of the first film layer 107 formed subsequently by deposition is improved.

In this embodiment, the surface of the substrate 100 is treated by directly introducing ammonia gas, argon gas, and hydrogen gas into a deposition chamber, so that the formation of a native oxide layer 103 at the interface, which is caused by exposure of a wafer to the atmospheric environment when exiting a machine for the substrate surface treatment step 104, is further prevented, thereby improving the quality of the contact interface between the film layer and the substrate 100 and improving the product yield.

Specifically, in the substrate surface treatment step 104, the process parameters include: the flow rate of the ammonia gas is 1500-3500 sccm, and specifically may be 2000 sccm, 2500 sccm, or 3000 sccm; the flow rate of the argon gas is 1000-2000 sccm, and specifically may be 1300 sccm, 1500 sccm, or 1800 sccm; the flow rate of the hydrogen gas is 1000-3000 sccm, and specifically may be 1500 sccm, 2000 sccm, or 2500 sccm; the temperature of the reaction chamber is 450-650 degrees Celsius, and specifically may be 500 degrees Celsius, 550 degrees Celsius, or 600 degrees Celsius; and the power is 450-1200 watts, and specifically may be 600 watts, 800 watts, or 1000 watts.

Figure 7:
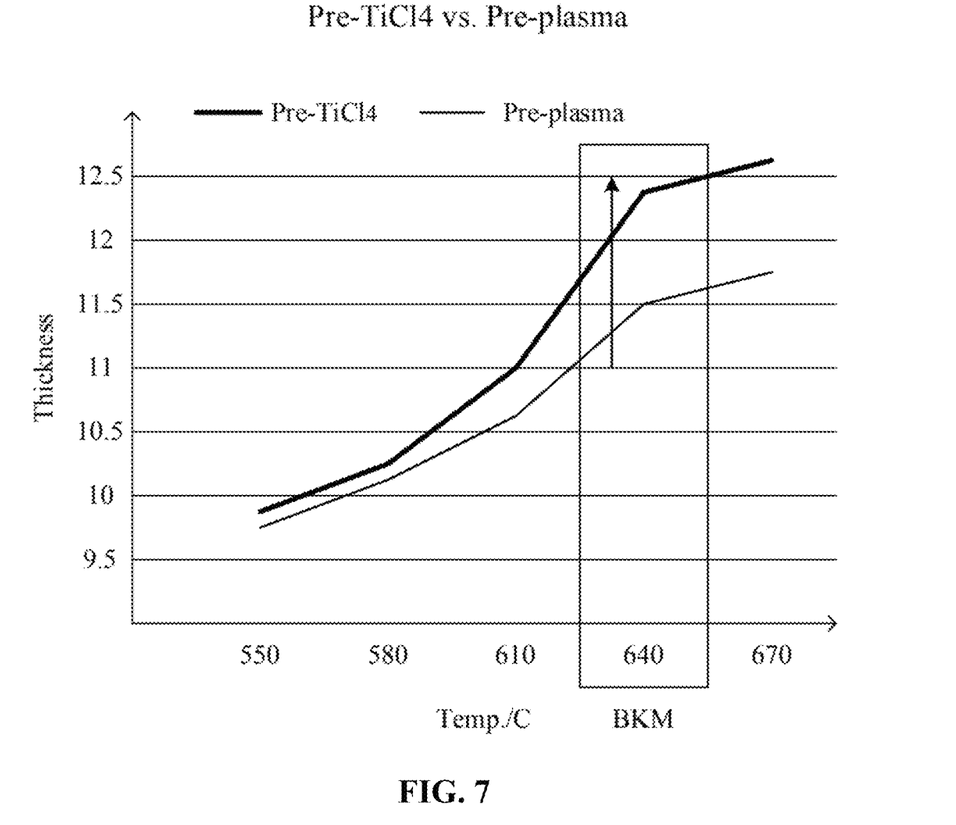
FIG. 7 is a broken line diagram of comparison of effects of pretreatment steps in the method for form a film layer provided by the first embodiment of this disclosure.

Referring to FIG. 4, in the first embodiment of this disclosure, a pretreatment step is performed after the substrate surface treatment step 104 to provide a reaction source gas 105 to form attachment points on the substrate 100. Referring to FIG. 7, at the same optimal reaction temperature and within the same reaction time, the thickness of the film layer deposited after the pretreatment step 104 is much greater than the thickness of the film layer deposited by plasma. In this way, a large number of attachment points are formed on the substrate 100, and the attachment points may specifically be nucleation sites. When the next deposition step is performed on the basis of the nucleation sites, the deposition rate of the first film layer 107 may be increased. Moreover, the attachment points are evenly distributed on the substrate 100, which improves the step coverage rate of the first film layer 107, thereby improving the quality of the first film layer 107.

Specifically, the process duration for providing titanium tetrachloride in the pretreatment step is 2-10 seconds, and specifically may be 4 seconds, 6 seconds, or 8 seconds. In this way, controlling the process duration for providing the titanium tetrachloride in the pretreatment step may effectively save the process cost while ensuring the effect of the pretreatment step.

Before the titanium tetrachloride is provided, argon gas and hydrogen gas are supplied for 5-20 seconds, specifically for 8 seconds, 12 seconds, or 16 seconds. In this way, the reaction chamber can be cleaned so that no impurity gas exists in the pretreatment step, and suitable reaction chamber conditions are provided for the reaction for forming the attachment points.

In the pretreatment step of this embodiment, the reaction source gas 105 includes titanium tetrachloride and hydrogen gas. By pretreating the surface of the substrate 100 with the titanium tetrachloride, titanium attachment points can be formed on the surface of the substrate 100, which can increase the subsequent deposition rate of the film layer and increase the step coverage rate of the film layer, thereby obtaining a high-quality film layer.

In an example, the flow rate of titanium tetrachloride is 1-50 sccm, and specifically may be 20 sccm, 30 sccm, or 40 sccm; and the flow rate of the hydrogen gas is 1000-3000 sccm, and specifically may be 1500 sccm, 2000 sccm, or 2500 sccm.

In another example, the reaction source gas 105 further includes an inert gas, which is supplied as a carrying gas. The inert gas includes argon gas, the flow rate of which is 1000-2000 sccm, and specifically may be 1200 sccm, 1400 sccm or 1600 sccm.

Referring to FIG. 5, in the deposition step of the first embodiment of this disclosure, the reaction source gas 105 is formed into a plasma 106, and the plasma 106 is deposited on the substrate 100 based on the attachment points to form the first film layer 107. In this way, the plasma 106 has more active chemical properties, and the reaction rate can be increased, so that the reaction rate of the deposition step is greater than the reaction rate of the pretreatment step, and the deposition rate is increased.

The first film layer 107 includes a titanium film layer. In the deposition step, the gaseous compound of titanium chloride reacts with hydrogen gas to form a titanium film layer.

Specifically, the process parameters of the deposition step include: the pressure of the reaction chamber is 1-20 Torr, and specifically may be 5 Torr, 10 Torr or 15 Torr; the temperature of the reaction chamber is 450-650 degrees Celsius, and specifically may be 500 degrees Celsius, 550 degrees Celsius, or 600 degrees Celsius; and the radio-frequency power is 450-1200 watts, and specifically may be 600 watts, 800 watts, or 1000 watts.

In the first embodiment of this disclosure, the flow rate of the reaction source gas 105 used in the pretreatment step is the same as the flow rate of the reaction source gas 105 used in the deposition step. In this way, the process can be simplified and the process is easy to operate, without changing the flow rate of the reaction source gas 105 between the pretreatment step and the deposition step.

In the first embodiment of this disclosure, the pretreatment step and the deposition step are performed in the same reaction chamber. In this way, in the process of forming the first film layer 107, the operation steps are simplified, so as to facilitate the process, and the pollution amount of the reaction chamber is also reduced.

In addition, in the pretreatment step and the deposition step, the pressures in the reaction chamber are the same, and the temperatures of the reaction chamber are the same. In this way, in the reaction chamber, between the pretreatment step and the deposition step, the process can be implemented by only changing the radio-frequency power of the reaction chamber, therefore the entire process is easy to operate.

Figure 6:
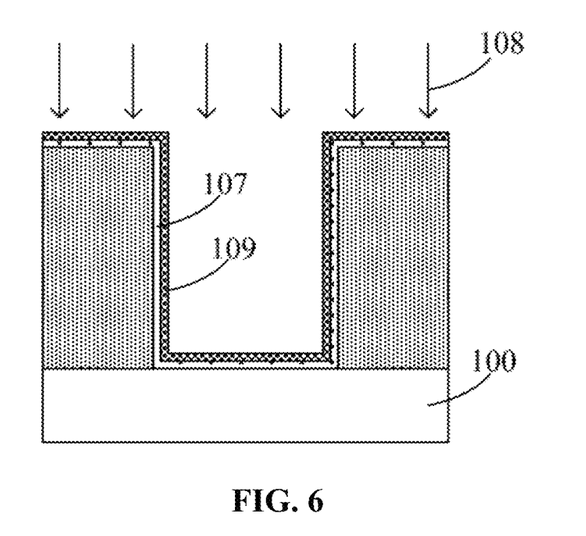
FIG. 6 is a sixth schematic structural diagram corresponding to a step in a method for forming a film layer provided by the first embodiment of this disclosure.

Referring to FIG. 6, in the first embodiment of this disclosure, after the first film layer 107 is formed, a second deposition step is further included to provide nitrogen source plasma 108 to the first film layer 107 to convert at least a part of the first film layer 107 into a second film layer 109 containing nitrogen.

The nitrogen source plasma 108 includes a nitrogen plasma, and the second film layer 109 may be titanium nitride.

Specifically, the process parameters of the second deposition step include: the flow rate of the ammonia gas is 1500-3500 sccm, and specifically may be 2000 sccm, 2500 sccm or 3000 sccm; the temperature of the reaction chamber is 450-650 degrees Celsius, and specifically may be 500 degrees Celsius, 550 degrees Celsius or 600 degrees Celsius; and the radio-frequency power is 450-1200 watts, and specifically may be 600 watts, 800 watts or 1000 watts.

In the first embodiment of this disclosure, the pulsed etching step, the substrate surface treatment step, the pretreatment step, the deposition step, and the second deposition step are performed in the same reaction chamber. In this way, in the process of treating the defective layer 101 and continuing to form a new film layer, all reactions are performed in the same reaction chamber without the need of changing the reaction chamber. The whole process operation can be performed more conveniently, which is conducive to quick remediation of the film layer after it is destroyed, and reduces the loss. All reactions are performed in the same reaction chamber, so the film layer is prevented from contacting the atmosphere, thereby generating a thicker defective layer 101. In this embodiment, the above reactions may be performed in a PECVD (Plasma Enhanced Chemical Vapor Deposition) machine chamber to obtain the second film layer 109.

The first embodiment of this disclosure provides a method for forming a film layer. In case a defective layer is formed on a substrate, the defective layer is removed relatively gently by a pulsed etching method, avoiding the risk that part of the defective film layer fall off caused by a continuous violent etching reaction and contaminate the reaction chamber. After the pulsed etching, the film layer can still be deposited to avoid the problem that a wafer is difficult to be repaired and thus is directly scrapped after an abnormality of the machine occurs. After the defective layer is removed by etching, the substrate surface treatment step is performed to remove the native oxide layer at the interface. The substrate surface treatment step removes the native oxide layer at the interface which is irrelevant to the subsequently deposited first film layer, reduces the contact resistance between the first film layer and the substrate, prevents the first film layer to be disconnected from the substrate due to the too high contact resistance, and also improves the uniformity of the surface of the first film layer formed subsequently by deposition. By adding the pretreatment step stage before the deposition step, the supplied reaction source gas forms a large number of attachment points on the substrate, which are specifically nucleation sites, and in the subsequent deposition step, the plasma formed from the reaction source gases reacts with the nucleation sites. Because a large number of the nucleation sites are formed on the substrate, the deposition step is performed on the basis of the nucleation sites, which increases the deposition rate of the film layer. Moreover, the attachment points are evenly distributed on the substrate, so the step coverage rate of the film layer is improved, thereby improving the quality of the film layer.

The method for forming a film layer of this embodiment is suitable for forming a bit line contact layer or a capacitor contact layer.

Figure 8:
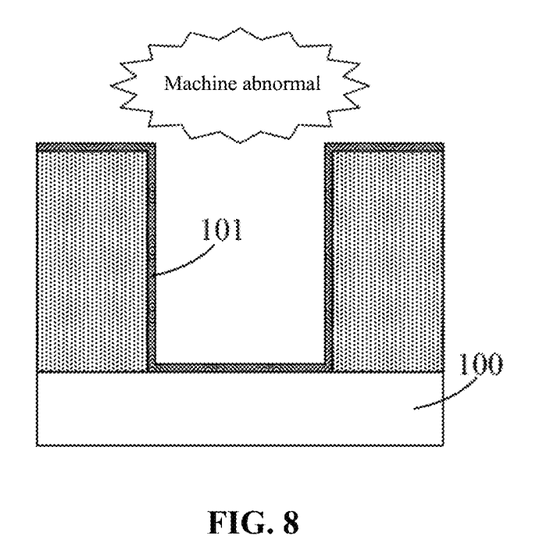
FIG. 8 is a schematic structural diagram of a method for forming a film layer provided by the second embodiment of this disclosure.

FIG. 8 is a schematic structural diagram of a method for forming a film layer provided by the second embodiment of this disclosure.

Referring to FIG. 8, in the second embodiment of this disclosure, the process of depositing the first film layer 107 or the second film layer 109 is forced to be suspended due to the abnormality of the machine. Due to high temperature of the reaction chamber, the deposited first film layer 107 or second film layer 109 is oxidized to form a defective layer 101, in which the defective layer 101 has the same elements as the first film layer 107. In this case, the wafer can be repaired by sequentially performing the pulsed etching step, the substrate surface treatment step, the pretreatment step, the deposition step, and the second deposition step. In this way, the problem that the wafer is difficult to be repaired and directly scrapped after the machine abnormality occurs is prevented.

Figure 9:
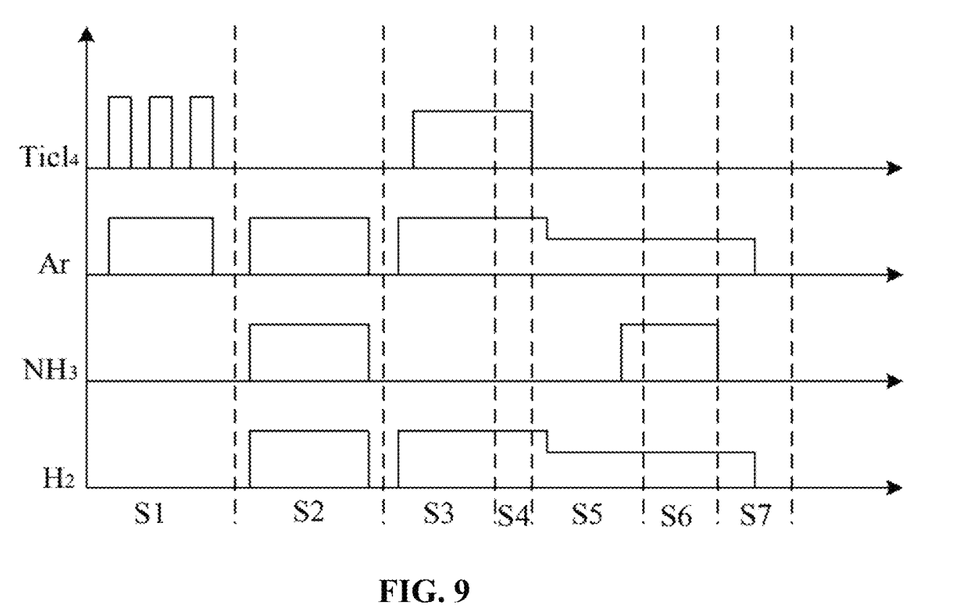
FIG. 9 is a gas-time broken line diagram provided in each step of a method for forming a film layer provided by an embodiment of this disclosure.

FIG. 9 is a gas-time broken line diagram provided in each step of a method for forming a film layer provided by an embodiment of this disclosure.

Referring to FIG. 9, in the embodiment of this disclosure, the time points when different gases are supplied at each stage in the process of treating the defective layer 101 formed due to the abnormality of the machine and continuing to form a new film layer are specifically explained.

When the machine is abnormal, the defective layer 101 is formed, and the pulsed etching step S1 is started. Titanium tetrachloride gas is supplied at intervals, and argon gas is supplied at the interval between two supplies of the titanium tetrachloride gas. After the pulsed etching step S1 is completed, the substrate surface treatment step S2 is started. Argon gas, ammonia gas and hydrogen gas are continuously supplied until the substrate surface treatment step S2 is completed. In the pretreatment step stage S3, argon gas and hydrogen gas are supplied, and then titanium tetrachloride gas is supplied until the deposition step S4 is completed; then supply of the titanium tetrachloride gas is stopped, and argon gas and hydrogen gas are continuously supplied. In the gas exchange step S5, the flow rate of the continuously supplied argon gas and hydrogen gas is reduced, and after the gas exchange step S5, ammonia gas is partially supplied to enter the second deposition step S6. Throughout the second deposition step S6, the argon gas, ammonia gas and hydrogen gas are continuously supplied, until the second deposition step S6 is completed, then supply of the ammonia gas is stopped, and the argon gas and hydrogen gas are still continuously supplied to enter a cleaning step S7. In the cleaning step S7, the argon gas and ammonia gas are supplied.

The second embodiment of this disclosure provides a method for forming a film layer. In case the machine is abnormal during the deposition of the film layer, the film layer is destroyed and the defective layer is formed, the wafer is repaired by sequentially performing the pulsed etching step, the substrate surface treatment step, the pretreatment step, the deposition step, and the second deposition step, thereby avoiding the problem that the wafer is difficult to be repaired and is directly scrapped after an abnormality occurs in the machine.

A person of ordinary skill in the art can understand that the above embodiments are specific embodiments for implementing this disclosure. In practical applications, various changes can be made in form and details without departing from the spirit and scope of this disclosure. Any person skilled in the art can make changes and modifications without departing from the spirit and scope of this disclosure. Therefore, the protection scope of this disclosure shall be subject to the scope defined by the claims.

What is claimed is:

1. A method for forming a film layer, comprising:
   providing a substrate;
   performing a pretreatment step, wherein the pretreatment step includes providing a reaction source gas, wherein the reaction source gas forms attachment points on the substrate; and
   performing a deposition step, wherein the reaction source gas is formed into plasma, and the plasma is deposited on the substrate based on the attachment points to form a first film layer;
   wherein prior to the performing the pretreatment step, an oxide layer is formed on the substrate; and the method further comprises: prior to the performing the pretreatment step,
   performing a substrate surface treatment step to remove the oxide layer;
   wherein in the substrate surface treatment step, plasma ammonia gas, argon gas, and hydrogen gas are used to react with and remove the oxide layer;
   wherein in the substrate surface treatment step, the process parameters comprise: a flow rate of the ammonia gas is 1500-3500 sccm, a flow rate of the argon gas is 1000-2000 sccm, a flow rate of the hydrogen gas is 1000-3000 sccm, a temperature of a reaction chamber is 450-650 degrees Celsius, and a power is 450-1200 watts.

2. The method for forming a film layer of claim 1, wherein a flow rate of the reaction source gas in the pretreatment step is the same as a flow rate of the reaction source gas in the deposition step.

3. The method for forming a film layer of claim 1, wherein the first film layer comprises a titanium film layer, and the reaction source gas comprises titanium tetrachloride and hydrogen gas.

4. The method for forming a film layer of claim 3, wherein process duration for providing the titanium tetrachloride in the pretreatment step is 2-10 seconds.

5. A method for forming a film layer, comprising:
   providing a substrate;
   performing a pretreatment step, wherein the pretreatment step includes providing a reaction source gas, wherein the reaction source gas forms attachment points on the substrate; and
   performing a deposition step, wherein the reaction source gas is formed into plasma, and the plasma is deposited on the substrate based on the attachment points to form a first film layer;
   wherein before performing the pretreatment step, an oxide layer is formed on the substrate; and the method further comprises: before performing the pretreatment step,
   performing a substrate surface treatment step to remove the oxide layer;
   wherein prior to the performing the substrate surface treatment step, a defective layer is formed on the substrate; and the method further comprises: before performing the substrate surface treatment step,
   performing a pulsed etching step, wherein an etching gas is supplied to the defective layer at intervals to remove the defective layer, and an inert gas is continuously supplied to the defective layer to take away etching by-products.

6. The method for forming a film layer of claim 5, wherein the etching gas has same elements as the reaction source gas for forming the first film layer.

7. The method for forming a film layer of claim 5, wherein in supplying of the etching gas to the defective layer at intervals, the etching gas is supplied for 0.1-40 seconds each time, and an interval between every two supplies of the etching gas is 0.1-5 seconds.

8. The method for forming a film layer of claim 5, wherein a reaction chamber is vacuumized to take away the etching by-products at the intervals between every two supplies of the etching gas, and a pressure during the vacuumizing is 0.1-1 Torr.

9. The method for forming a film layer of claim 5, further comprising: after the forming the first film layer, performing a second deposition step to provide a nitrogen source plasma to the first film layer to convert at least a part of the first film layer into a second film layer containing nitrogen.

10. The method for forming a film layer of claim 9, wherein the pulsed etching step, the substrate surface treatment step, the pretreatment step, the deposition step and the second deposition step are performed in a same reaction chamber.

\* \* \* \* \*